(12) United States Patent
Andrews

(10) Patent No.: US 8,930,912 B2
(45) Date of Patent: Jan. 6, 2015

(54) METHOD AND SYSTEM FOR PERFORMING SOFTWARE VERIFICATION

(75) Inventor: Jason Robert Andrews, Ham Lake, MN (US)

(73) Assignee: Cadence Design Systems, Inc., San Jose, CA (US)

( * ) Notice: Subject to any disclaimer, the term of this patent is extended or adjusted under 35 U.S.C. 154(b) by 1276 days.

(21) Appl. No.: 12/336,483

(22) Filed: Dec. 16, 2008

(65) Prior Publication Data

US 2010/0153924 A1    Jun. 17, 2010

(51) Int. Cl.
  *G06F 9/44*   (2006.01)
  *G06F 17/50*  (2006.01)
  *G06F 11/36*  (2006.01)

(52) U.S. Cl.
  CPC ........ *G06F 11/3688* (2013.01); *G06F 17/5022* (2013.01)
  USPC .......................................... 717/126; 717/174

(58) Field of Classification Search
  USPC ................................................. 717/126, 174
  See application file for complete search history.

(56) References Cited

U.S. PATENT DOCUMENTS

| | | |
|---|---|---|
| 6,272,451 B1 | 8/2001 | Mason et al. |
| 6,389,379 B1 | 5/2002 | Lin et al. |
| 6,571,373 B1 | 5/2003 | Devins et al. |
| 6,701,490 B1 | 3/2004 | Talukdar et al. |
| 6,842,883 B2 | 1/2005 | Whitehill |
| 7,996,836 B1* | 8/2011 | McCorkendale et al. ........ 718/1 |
| 2002/0120909 A1 | 8/2002 | Brouhard et al. |
| 2002/0152456 A1 | 10/2002 | Nightingale |
| 2007/0011631 A1* | 1/2007 | Fine et al. .......................... 716/5 |
| 2007/0136402 A1* | 6/2007 | Grose et al. ................... 707/206 |
| 2008/0209275 A1* | 8/2008 | Kwan et al. ...................... 714/38 |
| 2008/0270199 A1* | 10/2008 | Chess et al. ......................... 705/7 |
| 2009/0037885 A1* | 2/2009 | Edwards et al. ............... 717/128 |
| 2009/0172664 A1* | 7/2009 | Mostafa ............................. 718/1 |

FOREIGN PATENT DOCUMENTS

WO    9855879    12/1998

OTHER PUBLICATIONS

Jason Andrews, "Coverage Driven Methodology for Verification of SoC Hardware and Software Corner Cases", Aug. 7, 2006, p. 1-17.*
"Debugging Java Applications" Internet Citation. Jun. 1, 2005, pp. 1-21, XP007913397. http://java.sun.com/developer/Books/tools/NBFieldGuideChapter05.pdf.
Assaf et al. "Promising Complex ASIC Design Verification Methodology" Instrument and Measurement Technology Conference Proceedings, 2007. IMTC 2007 IEEE, May 1, 2007, pp. 1-6.
European Search Report dated Jun. 10, 2010 for Application No. EP09015071.
IEEE Standard for the Functional Verification Language e, IEEE Computer Society, Aug. 3, 2008.

* cited by examiner

*Primary Examiner* — Li B Zhen
*Assistant Examiner* — Duy Khuong Nguyen
(74) *Attorney, Agent, or Firm* — Vista IP Law Group, LLP

(57) ABSTRACT

Described is a method, system, and computer program product that provides control of a hardware/software system, and allows deterministic execution of the software under examination. According to one approach, a virtual machine for testing software is used with a tightly synchronized stimulus for the software being tested. A verification tool external to the virtual machine is used to provide test stimulus to and to collect test information from the virtual machine. Test stimulus from the verification tool that is external to the virtual machine provides the stimulation that incrementally operates and changes the state of the virtual machine. The stimulus is created and coverage is collected from outside the virtual machine by first stopping the virtual machine, depositing stimulus, and then reading coverage directly from the virtual machine memory while the machine is stopped.

36 Claims, 8 Drawing Sheets

METHOD AND SYSTEM FOR PERFORMING SOFTWARE VERIFICATION

BACKGROUND

Important steps in the modern software development process are the steps of testing and debugging software to ensure that the software will work and function as expected in its intended processing environment. These steps are usually implemented as methodical processes of finding and reducing the number of defects in the software program to make it behave as expected or intended.

These tasks are often made much more difficult if the software program is tightly coupled to other devices, subsystems, or programs because it is often difficult to determine and test the complex interactions between the software and the other subsystems and components in the overall system, particularly if the operating environment is constantly subject to multiple inputs and status changes. Moreover, changes in one part of the system may cause unexpected results and errors to emerge in other parts the system.

For example, programmers often have a problem testing software that runs in the context of an operating system because of the enormous number of complex inputs and interactions that occur on a near constant basis. One reason for this is because, when errors occur, it is very difficult to repeatedly observe the errors and to repeat the error in a deterministic way. This desire to be able to repeatedly observe the errors is very important for purposes of performing program debugging and correction.

A common example of a program that may need to be tested in the context of an operating system is a device driver that executes in the context of an operating system (such as the Linux operating system). A typical type of problem that occurs with device drivers is the intermittent problem that is experienced when the timing of events cause a problem, e.g., when a particular state S1 of the hardware combines with a particular state S2 of the device driver software such that an error occurs, where neither the state S1 of the hardware nor the state S2 of the software by themselves would cause an error but it is the combination of both states occurring at exactly the same time that causes the error.

In this situation, it is a common struggle for software engineers to attempt to observe such intermittent problems, and it is particularly difficult for the engineers to reproduce such problems so that they can be debugged. Since the problems are often timing related, typical debugging techniques such as using print statements or using a software debugger introduces changes to the system states which could change the system timing and mask the problem.

SUMMARY

Some embodiments of the present invention provide an approach that provides control of the hardware/software system, and allows deterministic execution of the software under examination. According to some embodiments, the current invention utilizes a virtual machine for testing software with a tightly synchronized stimulus for the software being tested. In some embodiments of the invention, a verification tool external to the virtual machine is used to provide test stimulus to and to collect test information from the virtual machine. Test stimulus from the verification tool that is external to the virtual machine provides the stimulation that incrementally operates and changes the state of the virtual machine. The stimulus is created and coverage is collected from outside the virtual machine by first stopping the virtual machine, depositing stimulus, and then reading coverage directly from the virtual machine memory while the machine is stopped.

Further details of aspects, objects, and advantages of the invention are described below in the detailed description, drawings, and claims. Both the foregoing general description and the following detailed description are exemplary and explanatory, and are not intended to be limiting as to the scope of the invention.

DETAILED DESCRIPTION

The present invention provides an approach that allows control of a hardware/software system, and permits deterministic execution of the software under examination. According to some embodiments, the current invention utilizes a "virtual machine" for testing software with a tightly synchronized stimulus for the software being tested.

In some embodiments of the invention, a verification tool external to the virtual machine is used to provide test stimulus (also referred to as "stimulus") to and to collect test information from the virtual machine. Rather than running test software from within the virtual machine, test stimulus that is external to the virtual machine provides the stimulation that incrementally operates and changes the state of the virtual machine. The stimulus is created and coverage is collected from outside the virtual machine by first stopping the virtual machine, depositing stimulus, and then reading coverage directly from the virtual machine memory while the machine is stopped so that no extra execution is required. After new stimulus is deposited into memory, the virtual machine is restarted. The concept of starting and stopping the virtual machine for the purpose of synchronization with the verification environment and for 'backdoor' read and write access to virtual machine is a novel feature of the invention, and allows full deterministic testing of the software that is under examination.

Figure 1:
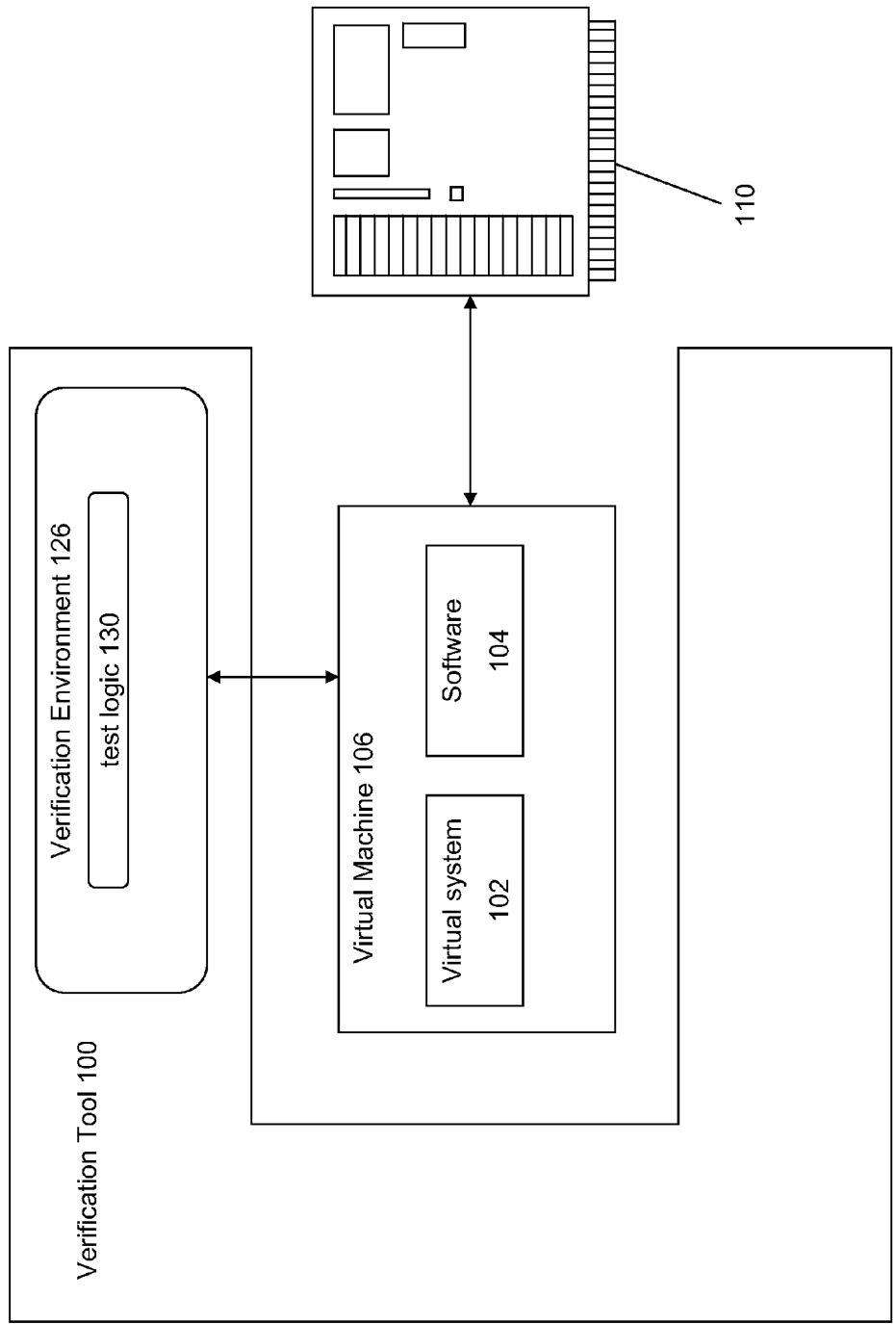
FIG. 1 provides a high-level illustration of verification of software using a virtual machine according to some embodiments of the invention.

FIG. 1 illustrates a general architecture for using a verification tool 100 in combination with a virtual machine 106 to test and debug software. A virtual machine 106 may be employed to execute the software 104 being tested on a virtual system 102. The virtual system 102 "virtualizes" the underlying real hardware/OS of an underlying physical machine 110. The virtual machine 106 essentially provides a software-implemented version 102 of the underlying system 110.

The verification tool 100 interacts with both the software design 108 and the virtual system 102 that is to be run on an actual hardware device 110, providing test stimulus that is used to test and verify the software 108. "Verification" is the term that is often used to refer to the process of determining whether a given design meets its requirements. In practice, verification is the process of identifying and removing as many functional bugs in the hardware and software as possible. According to the present embodiment, verification tool 100 is a computer aided design (CAD) tool or electronic design automation (EDA) tool that has the capability to utilize a verification environment 126 for testing a design having hardware, software, or a combination of both hardware and software. The verification environment 126 is used to create activity that is similar to the way the overall system is expected to behave, thereby providing stimulus to actively and thoroughly test the design. The test verification environment may be implemented using test software 130 in a language specific to the test system.

a. Any suitable verification tool can be employed in conjunction with embodiments of the invention. For example, the Specman/ISX products available from Cadence Design Systems, Inc. of San Jose, Calif. can suitably be used as a verification tool in conjunction with the present invention. The Specman product has the capacity to perform coverage driven verification based upon constrained random stimulus. The ISX product extends this functionality to the verification of software. The Specman/ISX products operate with a verification environment specified based upon the test software being in the "e" programming language, which is a general purpose testbench language that can be used for either hardware or software. The "e" programming language is an IEEE standard verification language (1647-2008), with further information about this language available from the IEEE website at the website: standards.ieee.org/announcements/IEEE1647_eLanguageStandard.html. Some of the illustrative examples in this document may be explained or described in conjunction with the structure, syntax, or context of the e language and/or the Specman/ISX operating environment. It is noted, however, that the invention may be applied to any suitable verification tool or environment, and is therefore not to be limited to any of the specific verification tools, programming languages, or environments described herein unless otherwise claimed.

A virtual machine 106 is a software implementation that is built above a hardware-based system and performs processing in a manner that is like a hardware-based system. Different variants of virtual machines exist that are either more or less tied to an actual physical machine. One reason for using a virtual machine 106 in the architecture of FIG. 1 is that the virtual machine technology can be used to emulate the hardware, operating system, and software of an underlying system 110. While some virtual machine implementations have a feature to record and replay an execution history that is meant to help debug software problems, this feature replays a fixed instruction sequence in a way that does not allow for any modification of the test program or any instruction changes. Therefore, it is usable only for debugging purposes and cannot be effectively used to generally perform verification upon a software application that covers different functions of the software with different coverages.

For the purposes of illustration, various embodiments of the invention will be described and explained with respect to specific examples of virtual machine implementations. It is noted, however, that the invention is not limited to the specific examples shown herein, and indeed, may readily be applied to other types of virtual machine implementations within the scope of the invention.

Figure 2:
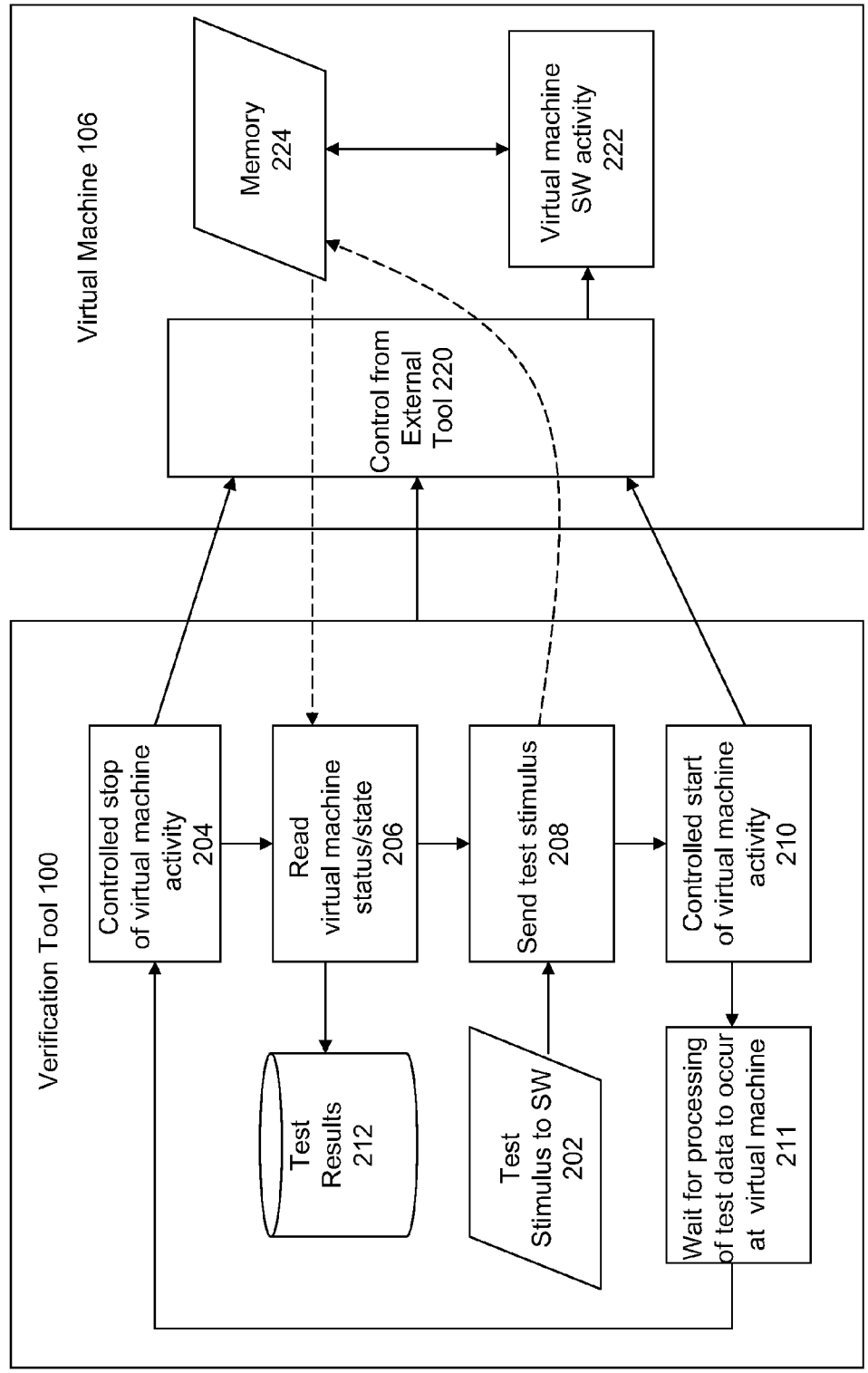
FIG. 2 illustrates verification of software according to some embodiments of the invention.

FIG. 2 illustrates the interaction between the verification tool 100 and the virtual machine 106 according to an embodiment of the invention. Virtual machine 106 is configured with a control interface 220 to allow external control of software 222 running within the virtual machine 106 from an external program.

In operation, verification tool 100 uses the control interface 220 to perform controlled stops 204 and starts 210 of activity within the virtual machine 106. During the controlled stop 204, test stimulus 202 can be applied to the virtual machine 106 to exercise the software 222 that is under test. One approach for performing this action of sending 208 the test stimulus 202 to the virtual machine 106 is to insert the test stimulus 202 into the memory 224 at the virtual machine 106 in the portions of the memory 224 that hold data for the software 222. Any suitable memory copy/access operation may be utilized to perform the act of inserting the test data into the memory 202.

In addition, during the controlled stop 204, the verification tool 100 can access/read 206 the memory 224 to obtain the state and status of the virtual machine 106. By accessing the memory 224 in this manner, the verification tool is able to collect the results 212 from the last cycle of tests that were performed upon the software 222. This action is performed by performing a memory copy/access operation upon the portion of the memory 224 that holds status and state data for the software 222, as well as the portions that hold status/state data for any other parts of the virtual machine that would be of interest, e.g., the operating system or hardware. In effect, the verification tool 100 provides an external monitor for the activities that occur at the virtual machine 106 based the test stimulus 202 that is applied to the virtual machine 106.

Once the test stimulus 202 has been sent to the virtual machine 106 and any necessary status/state results 212 have collected, a controlled start 210 is performed to restart activity at the virtual machine 106. The verification tool 100 waits 211 while the virtual machine 106 continues processing based upon the test stimulus 202 that was provided to the software 222.

At any point in the test cycle, the software test engineer can perform a controlled stop 204 to collect test data 212 and/or to provide further test stimulus 202. For example, the test engineer may perform a controlled stop 204 upon the occurrence of an error or at the end of a test cycle.

While FIG. 2 shows both collecting 206 of test data 212 and sending 208 of test stimulus 202 during a single cycle of start 210 and stop 204, it is noted that both activities 206 and 208 need not be performed during the same start/stop cycle. Instead, the start/stop cycles may be configured to only include collection 206 of data 212 or only the sending 208 of additional test stimulus 202.

Figure 3:
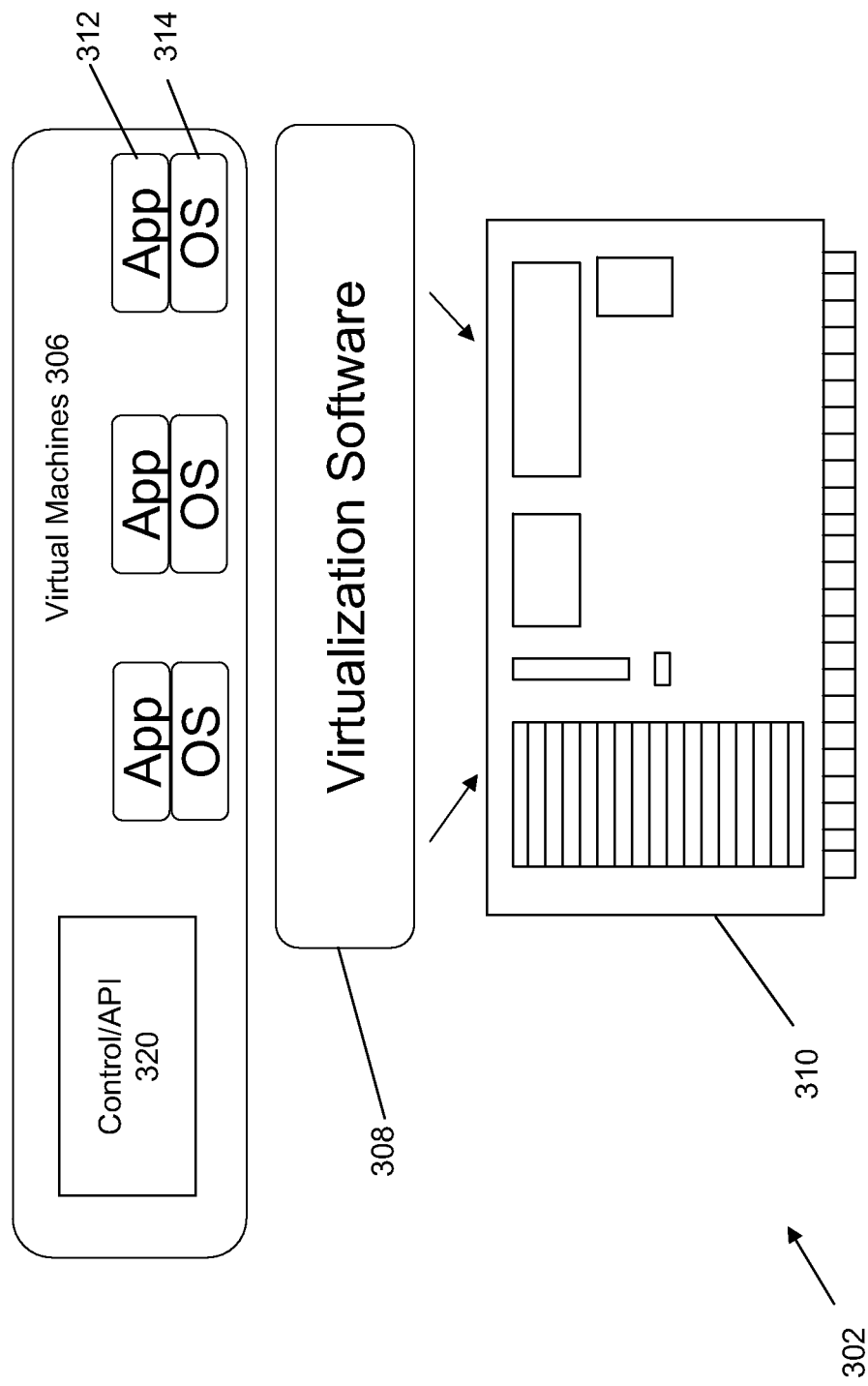
FIG. 3 illustrates a virtual machine architecture according to some embodiments of the invention.

FIG. 3 illustrates a virtual machine architecture 302 according to some embodiments of the invention. The lowest level of the virtual machine architecture 302 is the physical machine 310. Virtualization software 308 provides the mechanisms to virtualize the physical machine 310 into one or more software-based virtual machines 306. Two common variants of virtual machine implementations are the "system virtual machine" and the "process virtual machine", both of which may be employed in embodiment of the invention.

A system virtual machine provides a complete platform which supports the execution of a complete operating and run-time environment. System virtual machines (sometimes called hardware virtual machine) allow the sharing of the underlying physical machine resources between different virtual machines, each running its own operating system. The software layer providing the virtualization is called a virtual machine monitor or a hypervisor. Multiple operating systems can co-exist on the same computer, in isolation from each other. In addition, the virtual machine can provide an instruction set and machine controls that are different from that of the real underlying machine.

A process virtual machine runs as a single program and supports a single process. A process virtual machine runs as a normal application inside an operating system and supports a single process. The process virtual machine is created when that process is started and destroyed when it exits, and provides a platform-independent environment that abstracts away details of the underlying hardware or operating system, and allows a program to execute in the same way on any platform. This type of virtual machine is often used, for example, in conjunction with Java programming.

The virtualization software 308 is used to emulate the hardware, operating system, and software of an underlying physical system 310. This type of emulation is referred to as "full virtualization" of a system and can be implemented with the hypervisor of a system virtual machine. The hypervisor may run directly on the underlying hardware 310 or over an intervening operating system, such as Linux. Any suitable virtualization software may be used in conjunction with the present invention. Examples of commercially or openly available virtualization software include, for example, software from VMware, Xensource, and QEMU.

The virtual machine 306 comprises application software 312 and an operating system 314. Multiple virtual machines may co-exist in the system, with each running their own operating system 314 and application software 312. The present verification system can be used to test and debug multiple items of software running on multiple virtual machines.

Software interface 320 provides an external program with the ability to interact with and control the activities within the virtual machines 306. According to some embodiments of the invention, the software interface comprises a set of API (application programming interface) calls that are established by the vendors of the virtualization software to allow third party developers to create add-ons and modification to the virtualization mechanisms. It is this set of vendor-provided APIs that can be used to perform controlled starts and stops of the virtual machines while sending test stimuli to and collecting test results from the virtual machines.

Figure 4:
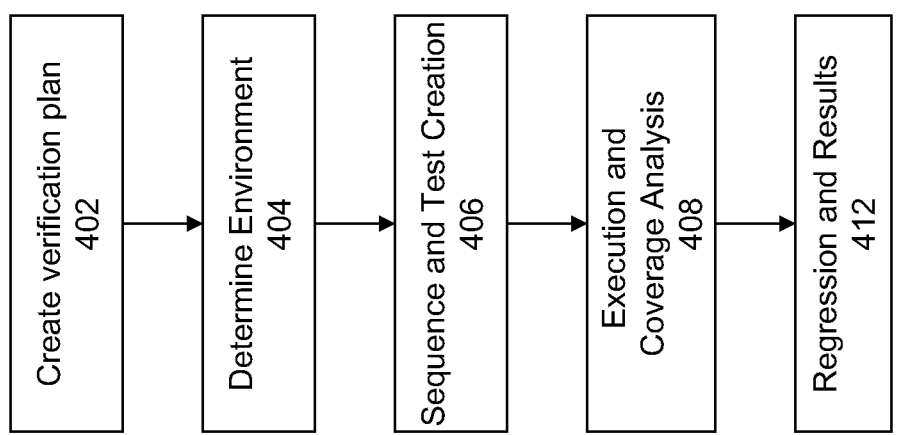
FIG. 4 shows a flow of a process for performing verification according to some embodiments of the invention.

FIG. 4 shows a flow of a process to be performed at the verification tool to generate test stimuli for the software to be tested. At 402, a verification plan is created for the intended testing. This action describes the software/hardware design that is to be verified, and provides parameters for the stimulus and coverage. The components of the operating environment may be described to create the verification plan. For example, the verification plan may identify the host operating system that runs the verification tool, the target operating system running under the virtual machine, and the description of any hardware that interacts with the software under test.

The verification tool may implement one or more automated verification plans containing a set of goal metrics that are used to measure progress toward verification completion. By definition of the plan(s), if these metrics are achieved, the design is verified. The process of verification planning is used to define the corner cases that need to be addressed, and the use of automated, constrained random stimulus to address these corner cases is known as Coverage Driven Verification (CDV). To perform CDV, the corner cases are converted into coverage points where the goal is to reach 100% coverage. Using random generation to reach coverage points may also result in new corner cases that engineers may not themselves have contemplated. Constrained random stimulus and functional coverage metrics may be applied to the software design in conjunction with "co-debugging", in which the system may be started and stopped to observe the behavior of the system. In this context, the term "co-debugging" means inspecting both the software program being verified and the hardware model running in the virtual machine.

The verification test should provide sufficient code and functional coverage of the software being tested. Code coverage items that can be addressed by the invention include, for example, line coverage, branch coverage, and function call coverage. Functional coverage items include values of variables including state variables, function call arguments, local variables, global variables, and function return values.

At 404, environment creation is performed to create the verification environment. This action defines and identifies the functions and variables to be accessed within the software under test. In addition, ports are identified to define the interfaces to the software under test. For example, if the "e" programming language is being used for the verification environment, then the method, simple, and event ports are generated at 204 to define the interfaces to the software under test. The software binary may be accessed, and functions and variables may be identified using debug-type information.

Sequence and test creation are performed at 406. This action creates software routines and variables for the verification sequence, where test sequences may be graphically created from the generated environment. The order and timing within the test sequence may be varied, and constraints defined for the test. Software code can also be created for the test files.

The test is created by identifying the specific functions and variables to operate upon for the software being tested. This action may be performed based upon user interaction and selection. Test generation information is then produced based upon the selected functions and variables. The test generation information may include function prototypes, variable names and data types, and data type size and representations. Function prototypes refer to the semantic representations of functions and their arguments. The information about variable names and sizes include the names and sizes of each of the variables that have been selected for testing. The information about type size and representations include type sizes and representations for the software program generated by the compiler during the process of compiling source code into analyzed object code.

The testbench generator takes as input the function prototypes, variable names and types, and type size and representations to produce a testbench that can be used by a verification tool to verify the software program. The verification tool will be used in conjunction with a software adapter or interface logic to connect the verification environment to the software being verified. For example, the Specman/ISX verification tool can be modified to include software adapter logic to interface a verification environment written in the e language to a Linux device driver that is written in the C programming language. The testbench includes information and constructs that are appropriate to allow the software adaptor from the verification tool to the virtual machine to operate with the software program being verified. For example, such information and constructs could include method/function ports, ports for variables, sequence information, coverage information, and type mappings. Type interpreter logic may be employed to generate the type mappings.

Figure 6:
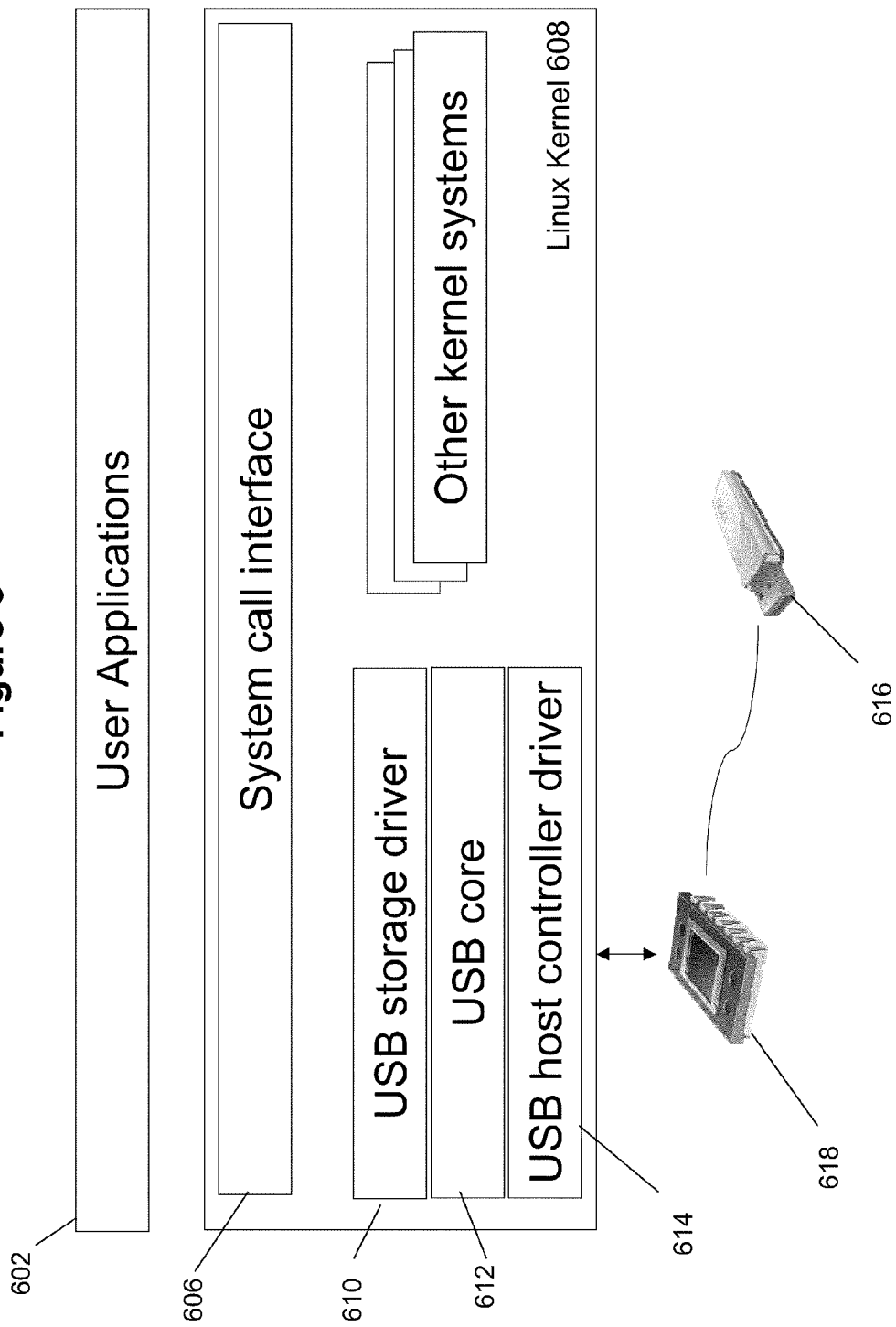
FIG. 6 illustrates a device driver in a Linux operating system according to some embodiments of the invention.
Figure 7:
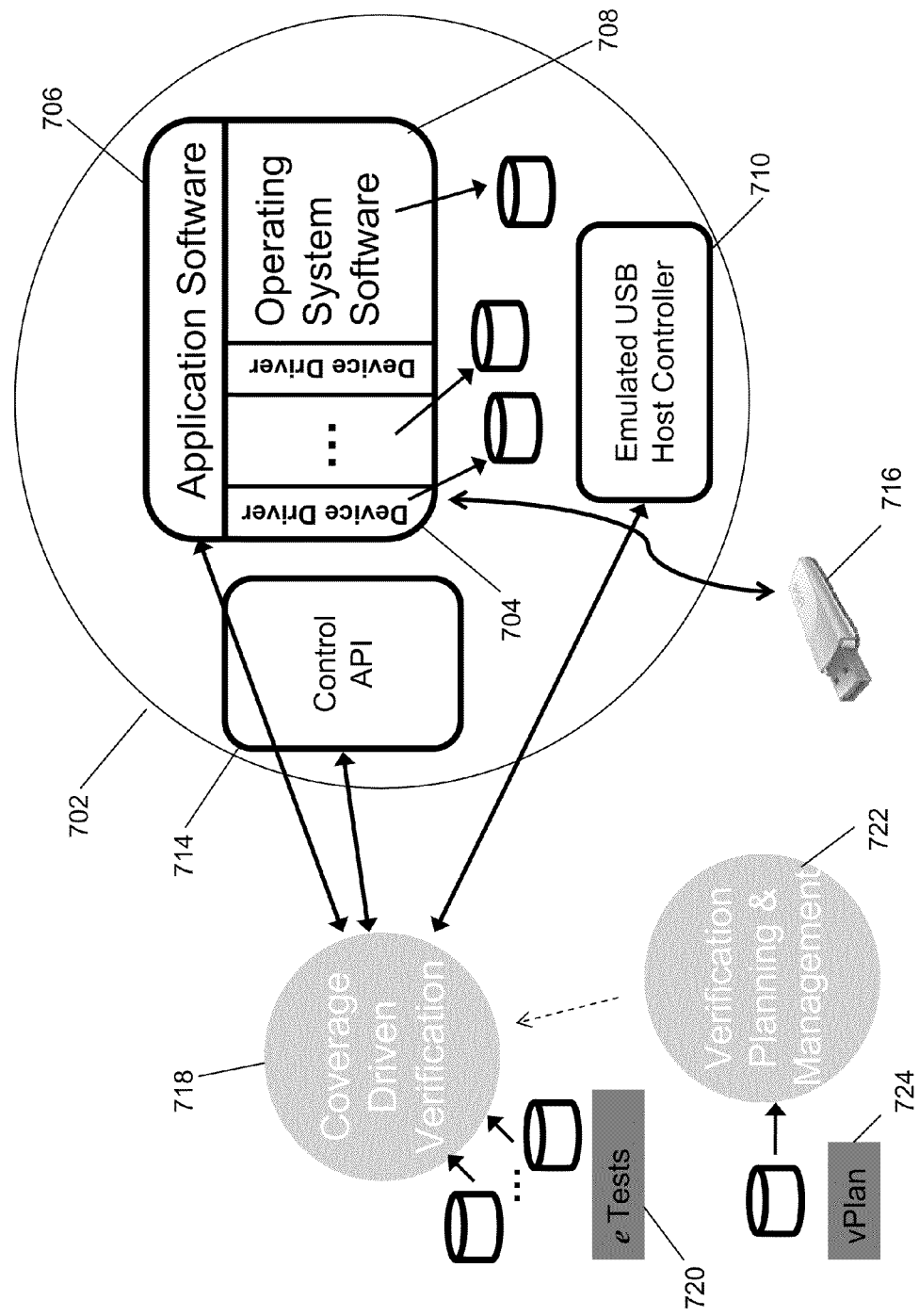
FIG. 7 illustrates verification of a Linux device driver according to some embodiments of the invention.

FIGS. 6 and 7 illustrate flowcharts of processes that can be employed to define ports that are used to interface between the source software language code and the test system language code. A port is a construct that is used to exchange communications between the test program code and the software program under test in the source language code. Any suitable operating system or programmatic approach can be used to implements ports that allow communications from a first software program to a second software program.

Ports allow communications between the methods and functions in the source and test language codes. Ports are generated by identifying the source method/function prototype for the method or function of the software program under test for which a port is needed. An identification is made of the method or function within the test system code that needs to communicate with the function or method in the software program under test. Output method ports can be defined that specifies the method prototype in the test system code and function prototype in the software program under test. The prototypes are used to map method/function parameters between the call to the method in the test system code and the function in the software program under test. The output port is called from within the verification environment to exchange information and to interact with functions in the program under test. Input method ports can be defined that specifies both the method prototype in the test system code and function prototype in the software program being tested. The input port is called from within the embedded software to return data or to interact with the test language code in the verification environment.

Ports can also be implemented between variables, which allow exchange and interaction between the variables in the software program being tested and the variables in the test language code, e.g., the verification environment. Identification is made of the source variable in the software program being tested for which a port is needed, as well as the variable type for which the port is needed. According to some embodiments, the variable could be an "event" variable or a non-event simple/standard variable. It is sometimes useful to be able to trigger an event based upon a change in a software variable. The event-type variable would be associated with event-type ports to allow the triggering of events. If it is desired to be able to trigger events with the variable, then an event port is defined for the variable. As an example, consider if the software design has a variable or attribute called "edge( )" which has allowed values of "rise", "fall", or "change". Further assume that it is desirable to allow the value or transition of value for this attribute to trigger an event within the verification environment. In this situation, an event port would be defined that can be used to trigger events within the verification environment or the software program being tested, e.g., for coverage and checking. If the variable is a standard or simple variable that is not to be used for triggering an event, then a standard/simple port is defined for the variable.

Given a set of functions, it may be desirable to configure the sequences in which those functions are called. As a simple example, to the extent the software program includes an "initialize" function to initialize the system, then it is likely to be desirable to make sure that this function is called at the start of processing before calling other substantive functions within the system. As another example, for the purpose of completeness in testing a software program, it may be desirable to implement several alternate sequences in which the functions within the software program are executed. To implement sequencing, identification is made for one or more items from the software under test for which it is desirable to impose a sequence. This action identifies, for example, functions from the software for which it may be desirable or beneficial to associate or imply a sequence. A determination is made of one or more sequences for the identified items from the embedded software. This action may be performed based upon the input from a user to select particular sequences of functions. In an alternate embodiment, this action may be performed automatically by the system to select one or more possible sequences based upon analysis of software code, based upon past activities or selections of the user, or based upon heuristics derived from past verification testing or other analysis factors. A software sequence environment is defined for the sequence items, which allows the creation of stimulus sequences that call the software methods and accesses the software variables. For example, the software sequence items could include a sequence of e language methods that are called in order to provide a sequenced set of stimulus to the embedded software program.

Execution and coverage analysis is performed at 408. This action is performed to run the test sequence against the software in the virtual machine. The test sequences may be generated with random data, which is inserted into the designated locations in the memory of the virtual machine. Coverage data may be collected from the virtual machine to determine whether the coverage of the test data is adequate. Controlled starts and stops are performed at the virtual machine to provide deterministic observation and testing of the software at the virtual machine.

The goal of a coverage-driven verification process to provide stimulus that gives adequate/complete coverage of the possible defect space for software under test. According to some embodiments of the invention, coverage information can be used, for example, to configure and tune the type, range, and values of stimulus for verifying the software. To accomplish this, identification is made of the objects for which it is desired to configure the coverage information or parameters. For example, this action can be used to identify method or method ports for which it is desired to configure coverage. One or more coverage items may be specified, which identifies the specific items for which it is desired to have coverage upon. For example, the value of specific variables may be defined as items for which it is desired to impose coverage upon. One or more coverage "events" may also be specified, which provides an event or temporal basis for checking coverage. For example, assume that it is desired to check the value of a particular variable at a given point in time. A coverage event may be configured to check that variable value at the designated point in time. One or more coverage groups may also be defined for the identified item, where the coverage group is an approach for imposing a grouping upon a set of coverage items. In an embodiment, the coverage group and event are defined to contain as many items as coverable port parameters. Additional coverage may be specified for the identified method. For example, a range of values can be defined for a method port. The specified range of values would be used to generate stimulus for the verification of the embedded software.

At 412, regression analysis is performed to check the test results. This action involves gathering any errors that occurred and coverage results across many runs with different random seeds and different tests. Since full testing involves many runs, if there are any errors then the engineer can go back and use the same test and the execution with the virtual machine can be exactly repeated to debug the errors. This highlights an advantage of the invention, since without the present invention there does not exist an effective way to repeat the errors and debug them.

Illustrative Example

An example of the invention will now be illustratively described for the verification of an operating system device driver. The task of programmatically creating a new device driver is normally considered a very difficult and complex project. There are many reasons for this. One reason is because a typical operating system uses many different device drivers, with many of the device drivers performing operations that may conflict with one another. Another reason is that concurrency and race conditions are common, particularly with multi-processing machines becoming more and more common.

Combined with the high-level of difficulty inherent in device driver programming is the severe lack of available tools that can adequately test such device drivers. For example, until the present invention, deterministic testing and test observation was not available to the device driver programmer. To test the device driver, the programmer would write a program that would test the device driver, e.g., a test program that calls the driver using system calls. The problem with this approach is that the test program would run on the same system as the device driver, creating an inherently unreliable test situation since the test program itself could have loading effects on the system that it is testing. Another approach is to run the device driver in a system context and see if it will work for its intended purpose. This approach is problematic because of the lack of deterministic behavior and lack of an ability to isolate specific causes of failures and problems. This may also involve manual steps such as a human to remove and insert the USB memory stick. Debug outputs can be obtained that take raw dumps of system memory or traces can be performed on the system. However, these approaches again have intrusive effects on the system and are very complex to perform, and often with very unintelligible data that must be analyzed.

Moreover, the act of testing the device driver is not just related to testing of the software by itself like other types of programming, but also requires the involvement of the underlying hardware as well to be present of the testing. In many cases, the hardware is not even available to the device driver programmer, e.g., because the hardware is still under development, it is expensive, or is just simply not available because of scarcity or high demand.

Figure 5:
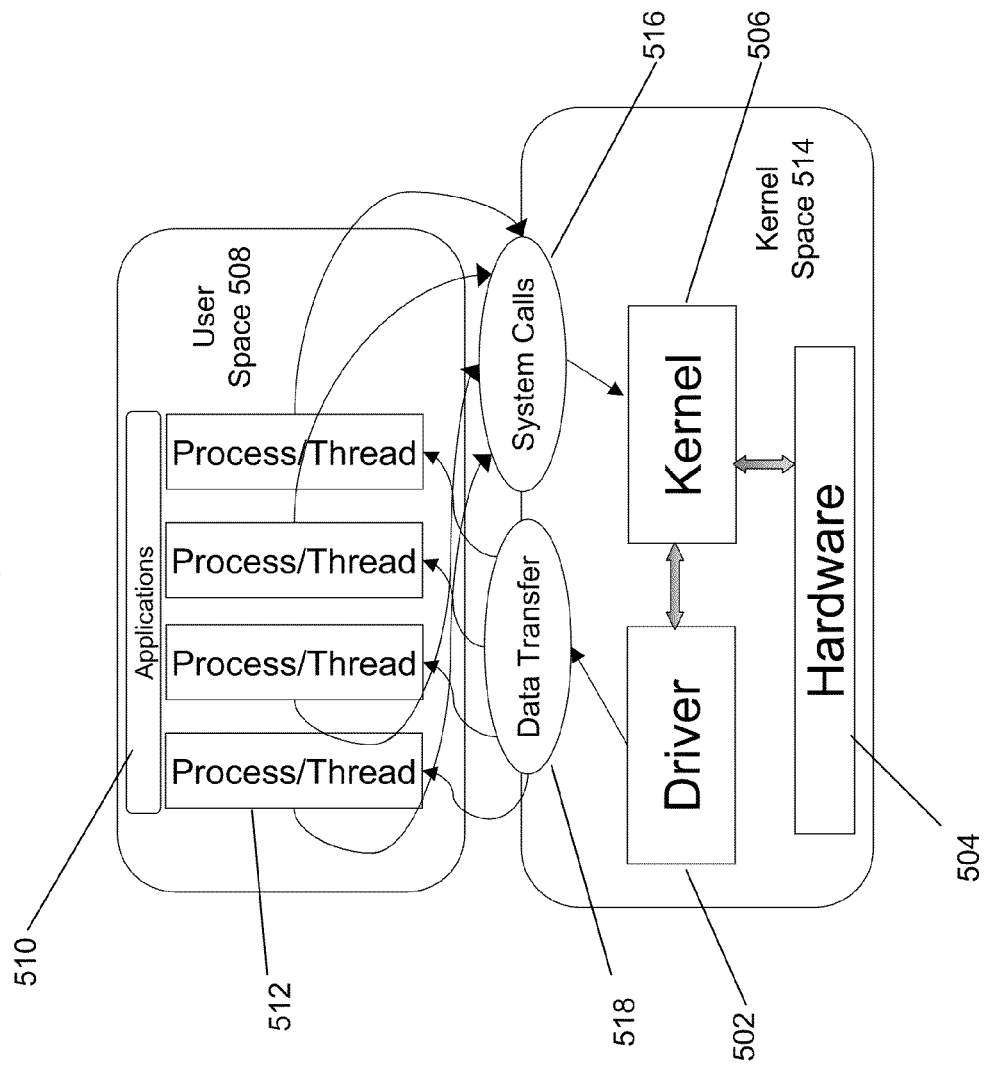
FIG. 5 shows a device driver in combination with its operating environment according to some embodiments of the invention.

FIG. 5 shows an example device driver 502 that may be used to control hardware 504 in the context of an operating system kernel 506. In the user space 508, one or more applications 510 may execute by running one or more processes/threads 512. The device driver 502 is the software that enables the hardware 504 to be used by the applications 510. Whenever the application 510 needs to operate or interact with an item of hardware 504 (such as a monitor, storage device, microphone, keyboard, mouse, or network device), the application 510 will interface and access the device driver 502 that corresponds to the desired item of hardware 504.

Device drivers 502 are specific to an operating system and normally cannot be reused between different operating systems. Therefore, the device driver may need to be re-written and/or recompiled to port the device driver and hardware to a new operating system.

The device driver 502 essentially executes as part of the operating system in the kernel space 514. Therefore, the device driver 502 must understand details of hardware operation and interface to operating system. In operation, system calls 516 are performed by the application 510 to the kernel 506 in the operating system. This causes data transfers 518 to occur between the processes/threads 512 in the user space 508 and the device driver 502 in the kernel space 514.

According to one embodiment of the invention, a verification tool is used to call the device driver to perform hardware operations, where the device driver is running on a virtual machine. Stimulus, checking, and coverage for the test program are generated and supplied with the verification tool. The test stimulus is generated outside of the virtual machine, e.g., using a command or sequence for the device driver to carry out. When the stimulus is ready it will be sent to the virtual machine. According to some embodiments, the stimulus generation program can be running on the same physical machine as the virtual machine.

The virtual machine will receive the stimulus, stop the virtual machine execution, use a 'backdoor' call in the virtual machine to deposit the stimulus command into virtual machine memory and then restart the virtual machine. The device driver test program will see the new stimulus when the virtual machine is restarted and apply it to the device driver.

The invention can illustratively be applied to test a USB (universal serial bus) storage driver intended to run on the Linux operating system. FIG. 6 illustrates a diagram of the stack of components that are used to implement a USB device driver in the Linux environment. The Linux kernel 608 functions as the main operating system program. Various user applications 602 may run in and above the Linux kernel 608. A systems call interface 606 interfaces between the user applications 602 and accesses made to the Linux kernel 608.

A USB hardware device 616 interfaces with a USB controller mechanism 618. A USB host controller driver 614 acts to control the operation of the USB controller mechanism 618. The USB core 612 provides the main programmatic functionality for the USB host controller driver 614. The USB storage driver is the operating system component that interacts with and controls the USB core 612.

FIG. 7 illustrates the system and process for performing verification upon a Linux device driver according to some embodiments of the invention. The verification is performed upon a virtual machine 702 implementation of device driver software 704 that is used to operate a USB storage device 716. The USB device is controlled by an emulated USB host controller 710. The virtual machine 702 also virtualizes operating software 708 and application software 702. In particular, the embedded software in the virtual machine 702 comprises the Linux kernel, the USB storage driver, the USB host driver, and the USB core driver. The virtual machine 702 may be implemented using any suitable virtualization software, such as the QEMU processor emulator software.

Coverage driven verification is performed using a verification tool 718, such as the ISX tool. The verification is driven with a set of one or more verification tests 720, e.g., test that are created using the "e" verification language. A verification planning tool 722 may be used to create a verification plan 724 to guide the process of generating the verification tests 720 using the verification tool 718. Any suitable verification planning tool may be employed within the scope of the invention, such as the Enterprise Manager (eManager) verification planning and management product, available from Cadence Design Systems, Inc. of San Jose, Calif.

Verification is performed based upon an application on the target machine that exercises the USB device driver. For example, functionality that may be exercised include mount, open, close, read, and write functionality for the USB device. The block and file system interfaces may also be exercised by the verification. In some embodiments, multiple instances may be employed to provide additional testing stress upon the device driver.

The tests 720 are inserted into the portions of the memory for the virtual machine 702 corresponding to the device driver 704 being verified. In addition, the tests 720 are used to modify the state of the emulated USB host controller 710, so that the emulation of the USB device under test realistically responds to any provided stimulus or changes in system conditions. The API 714 is employed to control the virtual machine 702, e.g., for performing a controlled stop to insert the data into the memory and for performing a controlled start to restart the virtual machine processing. The virtual network interface 714 is also employed to access the memory for the virtual machine 702, where memory access is to obtain the state of the system and software that is running on the virtual machine 702. This information can be analyzed to determine whether the device driver 704 is operating correctly.

The external nature of the test stimuli allows for more accurate testing that is not subject to interference based upon test itself. Instead, any timing errors that otherwise would occur while operating the device driver would still occur when running the external test stimuli, without fear that the testing itself would change the timing behavior and cause different or inconsistent results. Instead, the testing occurs in a deterministic way that allows the software engineer to maintain observability and repeatability of the software being tested.

Therefore, this technique eliminates the problems associated with either generating the stimulus commands inside the virtual machine or sending them from outside the virtual machine to the test program over a networking socket. In both cases, the control of when the device driver will receive the stimulus commands cannot be maintained and different results may occur due to timing differences due to other factors in operating system running in the virtual machine such as another program consuming some of the CPU time.

This invention can be applied to many areas of software verification both for stimulus generation such as in calling a software API or in passively collecting coverage information about software execution for the purpose of measuring functional coverage or for performance profiling.

System Architecture Overview

Figure 8:
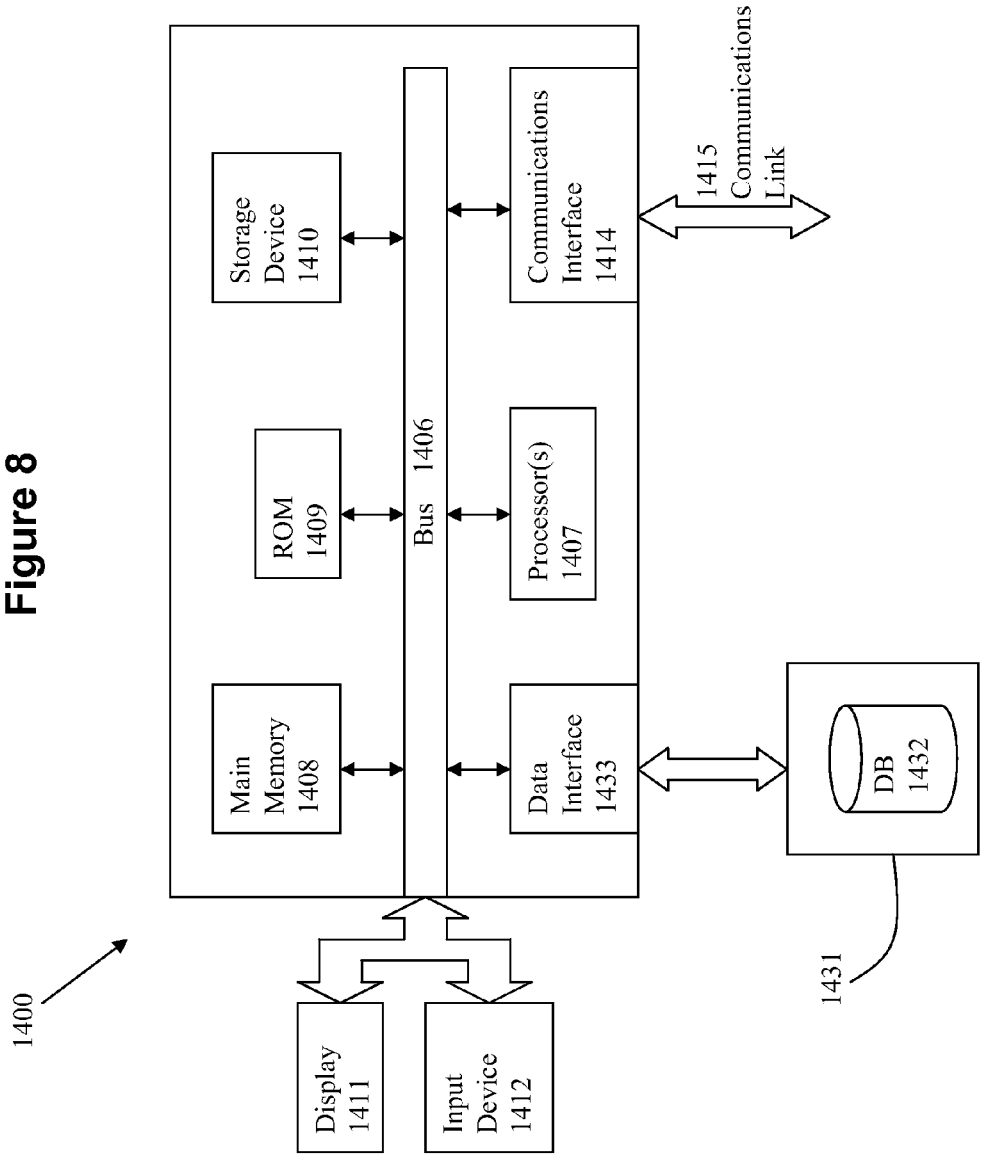
FIG. 8 shows an architecture of an example computing system with which the invention may be implemented.

FIG. 8 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The invention claimed is:

1. A computer program product that includes a non-transitory computer readable medium, the computer readable medium comprising a plurality of computer instructions which, when executed by at least one processor, cause the at least one processor to perform a process for verifying software, the process comprising:
    implementing software to be tested on a virtual machine;
    generating one or more test stimuli for the software, where the one or more test stimuli are generated external to the virtual machine;
    performing coverage driven verification by at least performing a controlled stop and a controlled start of the virtual machine without sending the one or more test stimuli to the software through a networking socket, wherein
    the controlled stop is performed to apply at least one constrained random stimulus of the one or more test stimuli to the software on the virtual machine for a coverage item or a coverage event for which coverage is desired, and
    the controlled start of the virtual machine is performed after the at least one constrained random stimulus of the one or more test stimuli is applied; and
    collecting results of the coverage driven verification from outside the virtual machine while the virtual machine is stopped.

2. The computer program product of claim 1 in which the software comprises a device driver software and the virtual machine virtualizes the device driver software, an operating system, and a hardware related to the device driver software.

3. The computer program product of claim 2 in which an additional test stimulus is generated to stimulate a host controller for the hardware.

4. The computer program product of claim 1 in which the one or more test stimuli are applied to the software by inserting the one or more test stimuli into memory at the virtual machine during the controlled stop.

5. The computer program product of claim 1 in which the controlled start is performed after the one or more test stimuli have been applied to the software.

6. The computer program product of claim 1 further comprising gathering of testing results during the controlled stop.

7. The computer program product of claim 6 in which the testing results comprise state information gathered from memory at the virtual machine.

8. The computer program product of claim 1 in which the controlled start and the controlled stop are performed using a control interface or application programming interface (API) to the virtual machine.

9. The computer program product of claim 8 in which the controlled stop logically stops processing activity at the virtual machine.

10. The computer program product of claim 1 in which a verification tool is used to generate the one or more test stimuli.

11. The computer program product of claim 10 in which the verification tool performs coverage driven verification.

12. The computer program product of claim 10 in which the verification tool performs the following:
    creating a verification plan;
    determining a verification environment;
    performing sequence and test creation; and
    performing coverage analysis.

13. The computer program product of claim 10 in which the verification tool performs regression analysis.

14. The computer program product of claim 1, in which a hardware device which the virtual machine models is not yet available for receiving the software to be tested.

15. A computer implemented method for verifying software, the process comprising:
    using at least one processor to perform a process, the process comprising:
    implementing software to be tested on a virtual machine;
    generating one or more test stimuli for the software, where the one or more test stimuli are generated external to the virtual machine;
    performing coverage driven verification by at least performing a controlled stop and a controlled start of the virtual machine without sending the one or more test stimuli to the software through a networking socket, wherein
        the controlled stop is performed to apply at least one constrained random stimulus of the one or more test stimuli to the software on the virtual machine for a coverage item or a coverage event for which coverage is desired, and
        the controlled start of the virtual machine is performed after the at least one constrained random stimulus of the one or more test stimuli is applied; and
    collecting results of the coverage driven verification from outside the virtual machine while the virtual machine is stopped.

16. The method of claim 15 in which the software comprises device driver software and the virtual machine virtualizes the device driver software, an operating system, and hardware related to the device driver software.

17. The method of claim 16 in which one or more additional test stimuli are generated to stimulate a host controller for the hardware.

18. The method of claim 15 in which the one or more test stimuli is applied to the software by inserting the one or more test stimuli into memory at the virtual machine during the controlled stop.

19. The method of claim 15 in which the controlled start is performed after the one or more test stimuli has been applied to the software.

20. The method of claim 15 further comprising gathering of testing results during the controlled stop.

21. The method of claim 20 in which the testing results comprise state information gathered from memory at the virtual machine.

22. The method of claim 15 in which the controlled start and the controlled stop are performed using a control interface or application programming interface (API) to the virtual machine.

23. The method of claim 22 in which the controlled stop logically stops processing activity at the virtual machine.

24. The method of claim 15 in which a verification tool is used to generate the one or more test stimuli.

25. The method of claim 24 in which the verification tool performs coverage driven verification.

26. The method of claim 24 in which the verification tool performs the following:
    creating a verification plan;
    determining a verification environment;
    performing sequence and test creation; and
    performing coverage analysis.

27. The method of claim 24 in which the verification tool performs regression analysis.

28. A system for verifying software, the process comprising:
    a computing system comprising software, hardware, and a virtual machine that virtualizes the software and the hardware; and
    a verification tool external to the virtual machine that is to use at least one processor of the computer system to generate one or more test stimuli, in which
        the verification tool is to perform coverage driven verification by at least performing a controlled stop and a controlled start of the virtual machine without sending the one or more test stimuli to the software through a networking socket, wherein
            the controlled stop is performed to apply at least one constrained random stimulus of the one or more test stimuli to the software on the virtual machine for a coverage item or a coverage event for which coverage is desired, and
            the controlled start of the virtual machine is performed after the at least one constrained random stimulus of the one or more test stimuli is applied; and
        the verification tool is further to collect results of the coverage driven verification from outside the virtual machine while the virtual machine is stopped.

29. The system of claim 28 in which the software comprises device driver software and the virtual machine virtualizes the device driver software, an operating system, and hardware related to the device driver software.

30. The system of claim 28 in which the one or more test stimuli are applied to the software by inserting the one or more test stimuli into memory at the virtual machine during the controlled stop.

31. The system of claim 28 in which the controlled start is performed after the one or more test stimuli have been applied to the software.

32. The system of claim 28 further comprising gathering of testing results during the controlled stop.

33. The system of claim 32 in which the testing results comprise state information gathered from memory at the virtual machine.

34. The system of claim 28 in which the controlled stop logically stops processing activity at the virtual machine.

35. The system of claim 28 in which a verification tool is used to generate the one or more test stimuli.

36. The system of claim 35 in which the verification tool performs coverage driven verification.

* * * * *